(12) United States Patent
Hoshino et al.

(10) Patent No.: US 8,947,520 B2
(45) Date of Patent: Feb. 3, 2015

(54) ELECTRON MICROSCOPE

(75) Inventors: Yoshinobu Hoshino, Hitachinaka (JP); Shigeru Kawamata, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 511 days.

(21) Appl. No.: 13/145,955

(22) PCT Filed: Jan. 19, 2010

(86) PCT No.: PCT/JP2010/050569
§ 371 (c)(1),
(2), (4) Date: Oct. 11, 2011

(87) PCT Pub. No.: WO2010/084860
PCT Pub. Date: Jul. 29, 2010

(65) Prior Publication Data
US 2012/0019648 A1  Jan. 26, 2012

(30) Foreign Application Priority Data
Jan. 22, 2009  (JP) ................. 2009-011986

(51) Int. Cl.
*H04N 9/47* (2006.01)
*H04N 7/18* (2006.01)
(Continued)

(52) U.S. Cl.
CPC ............. *H01J 37/26* (2013.01); *H01J 37/244* (2013.01)
USPC .......................................................... 348/80

(58) Field of Classification Search
USPC .................... 348/79, 80, 131, 132; 375/240.01–240.27
See application file for complete search history.

(56) References Cited

U.S. PATENT DOCUMENTS 7,003,037 B1 * 2/2006 Bordes et al. ............ 375/240.16

2003/0039386 A1    2/2003 Ishitani et al.
(Continued)

FOREIGN PATENT DOCUMENTS

JP   61-029059   2/1986
JP   08-273578   10/1996
(Continued)

OTHER PUBLICATIONS

Yamada et al., "Simultaneous Observations of Different Type Images in a Scanning Electron Microscope", In: Microsc. Microanal., 11(Suppl 2), 2005, pp. 746-747.
(Continued)

*Primary Examiner* — Andy Rao
*Assistant Examiner* — Jared Walker
(74) *Attorney, Agent, or Firm* — McDermott Will & Emery LLP

(57) ABSTRACT

An electron microscope according to the present invention includes: a backscattered electron detector provided with a backscattered electron detecting element (9); a low-vacuum secondary electron detector provided with a bias electrode (11) and a specimen stage (12); and a signal switch (14) that switches signals detected by the detectors. Optimal observation conditions are stored in an observation condition memory (20) for each of the detectors. A CPU (19) calls observation conditions stored in the observation condition memory (20) on the basis of the switching of the detectors, and sets conditions of the electron microscope to the called observation conditions. An image processing device (22) converts a plurality of the detected signals obtained on the basis of the switching of the detectors into two-dimensional image signals and evaluates the qualities of images of the two-dimensional image signals. In an image quality prioritized mode, the CPU (19) selects a detector causing an evaluated value to be highest on the basis of the results of the evaluation performed by the image processing device (22) and causes an image to be displayed. In the electron microscope that includes the plurality of detectors, a detector can easily be selected, and the optimal observation conditions for the detectors can easily be set.

9 Claims, 3 Drawing Sheets

(51) Int. Cl.
*H01J 37/26* (2006.01)
*H01J 37/244* (2006.01)

(56) References Cited

U.S. PATENT DOCUMENTS

2004/0064283 A1* 4/2004 Preiksas et al. ............... 702/107
2007/0268967 A1* 11/2007 Demos .................... 375/240.15

FOREIGN PATENT DOCUMENTS

| JP | 2000-188075 | 7/2000 |
| JP | 2001-155675 | 6/2001 |
| JP | 2005-353613 | 12/2005 |
| JP | 2007-207763 | 8/2007 |

OTHER PUBLICATIONS

"Fully Automated Gunshot Residue Analysis", For Quanta series SEM, Application Note, FEI Company, Hillsboro, USA, 2004.
JSM-7600F Brochure,Ultrahigh Resolution Analytical Thermal FE SEM, JEOL USA Inc., Peabody, USA, 2008.
German Office Action issued in German Application No. 11 2010 000 687.3 mailed on Nov. 16, 2012.

* cited by examiner

FIG. 3

ELECTRON MICROSCOPE

RELATED APPLICATIONS

This application is the U.S. National Phase under 35 U.S.C. §371 of International Application No. PCT/JP2010/050569, filed on Jan. 19, 2010, which in turn claims the benefit of Japanese Application No. 2009-011986, filed on Jan. 22, 2009, the disclosures of which Applications are incorporated by reference herein.

TECHNICAL FIELD

The present invention relates to an electron microscope and more particularly to an electron microscope suitable for selecting a detector for the electron microscope and setting observation conditions based on the selected detector.

BACKGROUND ART

There are a plurality types of detectors that are provided for an electron microscope and use different detection methods. A scanning electron microscope having especially a low-vacuum observation function may include, in addition to a secondary electron detector used in a high vacuum of 1 Pa or less, a backscattered electron detector and a low-vacuum secondary electron detector. The backscattered electron detector serves as means for detecting a signal in a low vacuum of 1 Pa or higher and detects an backscattered electron from the surface of a specimen by irradiation of the surface of the specimen with an electron beam. The low-vacuum secondary electron detector uses an amplification effect in which such a process is repeated that a secondary electron that is generated from the surface of a specimen by irradiation of the surface of the specimen with an electron beam collides with a gas molecule remaining in a specimen chamber so that the gas molecule is divided into an electron and a positive ion.

To switch signals detected by the detectors, in addition to the switching operation, such operations are required as inserting the detectors in the specimen chamber and setting a working distance, a vacuum level, an acceleration voltage, and the diameter of an electron beam and operations for these settings are complicated. For example, from the perspective of a theoretical resolution that depends on the diameter of the electron beam, it is preferable that the working distance and the diameter of the electron beam be set to small values. When the backscattered electron detector is used, if the working distance is small, an electron that is specularly reflected near the electron beam deviates from an electron beam path of the detector to propagate upward, resulting in reducing in the detection efficiency. In addition, since reducing the diameter of the electron beam means reducing the amount of a current of the electron beam, the amount of secondary electrons generated by irradiation of the specimen with the electron beam is reduced and the amount of backscattered electrons from the specimen by the irradiation is reduced. Therefore, the optimal working distance and the optimal diameter of the electron beam are empirically determined on the basis of the relationship between the detection efficiency and the diameter of the electron beam. As for a vacuum level, the low-vacuum secondary electron detector uses amplification of gas that remains in the specimen chamber. Therefore, although the efficiency of detecting a signal is higher in a low vacuum, the electron beam used for irradiation of the specimen more largely scatters as the vacuum level decreases, resulting in a deterioration of the quality of an image when the vacuum level is lower than a certain value. As for an acceleration voltage, although the resolution is generally higher as the acceleration voltage is higher, the acceleration voltage is set, in considerations of damage to the specimen and of influence of electric charges, within a range of low value of acceleration voltage in which the generation efficiency of secondary electrons and backscattered electrons, which are generated by the irradiation of the specimen with the electron beam, is sufficiently obtained. In addition, as the acceleration voltage is higher, the location at which the secondary electrons are excited is deeper from a surface layer of the specimen. As the acceleration voltage is lower, the location at which the secondary electrons are excited is shallower from the surface layer of the specimen. Thus, since the quality of an image varies depending on the acceleration voltage, the acceleration voltage is adjusted to obtain a desired quality of the image. However, when the acceleration voltage is lower than the low value that allows the generation efficiency of secondary signals to be sufficiently high, the amount of the secondary signals is reduced, and the quality of the image is not satisfactory due to noise occurring in the image. The detectable lower limit of the intensities of the secondary signals, i.e., the lower limit of the acceleration voltage that allows the quality of an image to be satisfactory, depends on the detection sensitivity of the detector.

A technique described in Patent Document 1 is known as an example in which insertion of detectors is improved in mechanism. However, it is necessary to separately set observation conditions such as a working distance and a vacuum level. For comparison with the qualities of images expressed by signals detected by detectors, it is necessary to repeat switching of the detectors and setting of the observation conditions for each of observations.

RELATED ART DOCUMENT

Patent Document

Patent Document 1: JP-2001-155675-A

SUMMARY OF THE INVENTION

Problem to be Solved by the Invention

In an electron microscope that has at least two detectors that lead to a change in the states of images (to be observed) depending on observation conditions including a vacuum level, a working distance, an acceleration voltage and the diameter of an electron beam, as a criterion for selection of a signal to be observed, following cases are considered. One is a case in which a detector to be used is first selected, and the observation conditions are adjusted on the basis of the type of the selected detector. The other case is that the observation conditions are determined and a detector that is suitable for the determined observation conditions is selected for an observation. In each of the cases, an operator needs to change the observation conditions, visually compare images obtained by the detectors while seeking conditions causing the highest quality of an image and the types of the detectors, and select an image. Thus, the operation is cumbersome, and the operator needs to have experience. In addition, an image cannot be observed depending on the conditions.

An object of the present invention is to provide an electron microscope that has a plurality of detectors, wherein a detector can easily be selected from among the detectors, and observation conditions that are suitable for each of the detectors can easily be set.

Means for Solving the Problem (1) To accomplish the aforementioned object, according to the present invention, an electron microscope includes: a plurality of detectors that are different in type and detect signals generated by irradiation of a specimen with an electron beam; signal switching means for switching the signals detected by the detectors; storage means for storing observation conditions that are suitable for each of the plurality of detectors; and control means for calling observation conditions stored in the storage means on the basis of the switching of the plurality of detectors and setting conditions of the electron microscope to the called observation conditions.

(1) In the electron microscope that has the plurality of detectors and the aforementioned configuration, it is easy to select a detector from among the detectors and set the observation conditions that are suitable for each of the detectors.

(2) The electron microscope described in the item (1) preferably further includes image processing means for converting the detected signals obtained on the basis of the switching of the plurality of detectors into two-dimensional image signals and evaluating the qualities of images of the two-dimensional image signals, the switching being controlled by the control means, wherein the control means selects a detector causing the evaluated value to be highest from among the detectors on the basis of the results of the evaluation performed by the image processing means, and causes the image to be displayed.

(3) In the electron microscope described in the item (2), the image processing means preferably uses frequency characteristics of the image signals to evaluate the qualities of the images of the two-dimensional image signals.

(4) In the electron microscope described in the item (2), the image processing means preferably measures SN ratios that are the ratios of the signals included in the images to noise so as to evaluate the qualities of the images of the two-dimensional image signals.

(5) In the electron microscope described in the item (1), it is preferable that the observation conditions include a working distance, and the control means call the working distance stored in the storage means on the basis of the switching of the plurality of detectors, and change the position of a specimen stage included in the electron microscope so that the actual working distance is set to the called working distance.

(6) In the electron microscope described in the item (1), it is preferable that the observation conditions include a vacuum level, and the control means call the vacuum level stored in the storage means on the basis of the switching of the plurality of detectors, and control a vacuum level in a specimen chamber included in the electron microscope so that the vacuum level in the specimen chamber is set to the called vacuum level.

(7) In the electron microscope described in the item (1), it is preferable that the observation conditions include an acceleration voltage, and the control means call the acceleration voltage stored in the storage means on the basis of the switching of the plurality of detectors, and control a high-voltage generation circuit included in the electron microscope so that the actual acceleration voltage is set to the called acceleration voltage.

(8) In the electron microscope described in the item (1), it is preferable that the observation conditions include the diameter of the electron beam, and the control means call the electron beam diameter stored in the storage means on the basis of the switching of the plurality of detectors, and control the amount of the electron beam to be focused by a focusing lens included in the electron microscope so that the actual diameter of the electron beam is set to the called diameter of the electron beam.

(9) In the electron microscope described in the item (1), it is preferable that the observation conditions include the amount of an electron beam current, and the control means call the electron beam current amount stored in the storage means on the basis of the switching of the plurality of detectors, and control the amount of the electron beam to be focused by a focusing lens included in the electron microscope so that the actual amount of the electron beam current is set to the called amount of the electron beam current.

(10) The electron microscope described in the item (1) preferably further includes a signal setting operation unit that sets the observation conditions that are criteria for selection of the detectors.

According to the present invention, it becomes easy for the electron microscope provided with a plurality of detectors to select a detector from among the detectors and set the observation conditions suitable for each of the detectors.

BRIEF DESCRIPTION OF THE DRAWINGS

FIG. 3 is a flowchart of operations of selecting a signal, which are performed by the electron microscope according to the embodiment of the present invention.

MODE FOR CARRYING OUT THE INVENTION

The configuration and operations of an electron microscope according to an embodiment of the present invention are described with reference to FIGS. 1 to 3.

First, the entire configuration of the electron microscope according to the present embodiment is described with reference to FIG. 1.

Figure 1:
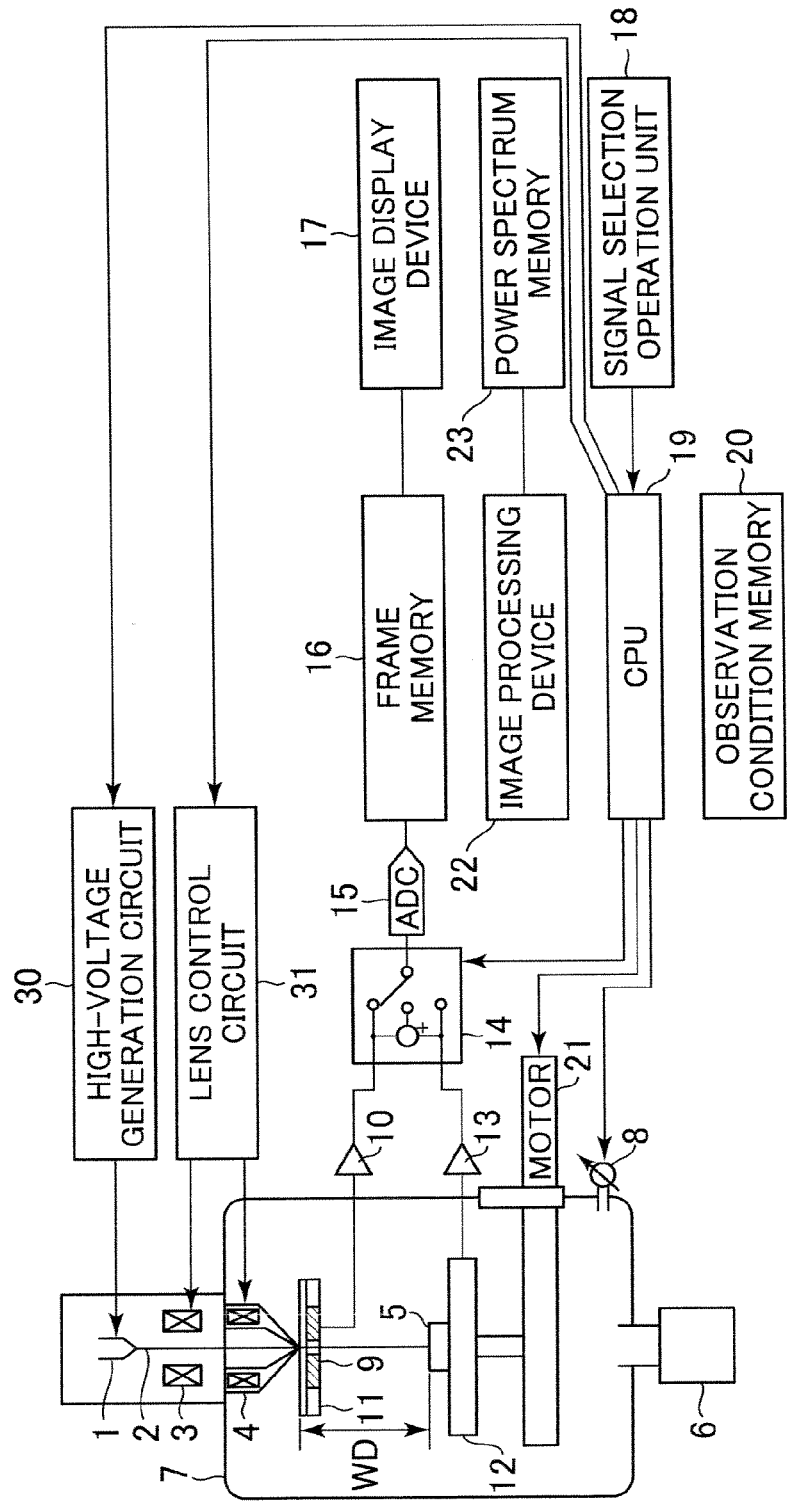
FIG. 1 is a system configuration diagram showing the entire configuration of an electron microscope according to an embodiment of the present invention.

FIG. 1 is a system configuration diagram showing the entire configuration of the electron microscope according to the embodiment of the present invention.

The electron microscope according to the present embodiment includes a low-vacuum observation function and has two detectors, which are a backscattered electron detector and a low-vacuum secondary electron detector.

An electron beam 2 that is emitted from an electron gun 1 is focused by a focusing lens 3 and an objective lens 4 so that a specimen 5 is irradiated with the electron beam 2. An acceleration voltage to be applied to the electron beam 2 emitted from the electron gun 1 is controlled by a high-voltage generation circuit 30. The amount of the electron beam 2 to be focused by the focusing lens 3 and the objective lens 4 is controlled by a lens control circuit 31. For example, the state in which the diameter of the electron beam is smallest and the amount of a current of the electron beam is smallest, or the state in which the amount of an excitation current applied to the focusing lens is largest, is regarded as 0. The state in which the diameter of the electron beam is largest and the amount of the current of the electron beam is largest, or the state in which the amount of the excitation current applied to the focusing lens is smallest, is regarded as 100. Thus, the diameter of the electron beam is controlled in 100 steps on the basis of the amount of the excitation current. When pressure in a specimen chamber 7 is at a low vacuum level, a discharge device 6 evacuates the specimen chamber 7, controls the amount of air to be introduced into the specimen chamber 7 by controlling the amount of an opening degree of a leak valve 8, and thereby controls the vacuum level in the specimen chamber 7.

As the two detectors, the backscattered electron detector and the low-vacuum secondary electron detector are provided. The backscattered electron detector includes a backscattered electron detecting element 9. An backscattered electron by the irradiation of the specimen 5 with the electron beam 2 is detected by the backscattered electron detecting element 9 and amplified by an amplifier 10. The low-vacuum secondary electron detector includes a bias electrode 11 and a specimen stage 12. A secondary electron is generated by the irradiation of the specimen 5 with the electron beam 2 and accelerated so that the secondary electron travels toward the bias electrode 11 to which a high voltage has been applied. Then, gas amplification occurs. In the gas amplification, the following process is repeated. In the process, the accelerated secondary electron collides with residual gas that exists in the specimen chamber 7 so that the residual gas is separated into a positive ion and an electron; and the electron separated from the residual gas collides with other residual gas during a process in which the electron separated from the residual gas travels toward the bias electrode 11 so that the other residual gas is separated into a positive ion and an electron. The positive ion that is separated from the residual gas by the collision of the secondary electron with the residual gas receives an electron from the specimen stage 12 so that the positive ion and the electron form a gas molecule again. Thus, an absorption current of the specimen stage 12 is detected and amplified by the amplifier 13 so that a low-vacuum secondary electron signal is detected. In addition, since the absorption current of the specimen stage 12 is nearly equivalent to the electron separated from the residual gas that reaches the bias electrode 11, the low-vacuum secondary electron signal can be detected by detecting a current that flows from the bias electrode 11.

A signal switch 14 selects a signal detected by the backscattered electron detector and output from the amplifier 10 of the backscattered electron detector or a signal detected by the low-vacuum secondary electron detector and output from the amplifier 13 of the low-vacuum secondary electron detector. The selected signal is digitalized by an analog digital converter to be stored in a frame memory 16 as image data. The image data that is output from the detector and stored in the frame memory 16 is observed using an image display device 17.

The quality of the image to be observed obtained by each of the detectors varies depending on observation conditions such as a working distance and a vacuum level. In addition, the optimal values of the observation conditions vary depending on the type of the detector and a detection principle.

In general, since noise occurs in all frequency bands of the signals detected by the electron microscope, it is difficult, in the single detected signal, to automatically distinguish noise from a signal that expresses a surface structure of the specimen on a power spectrum. However, when the intensities of signals of the same frequency are high on power spectra of signals detected by different detectors, the frequency can be regarded to express a specific structure of the specimen. By comparing the intensities of the signals of the frequency, it can be determined whether or not a fine surface structure of the specimen is clearly displayed. For example, the low-vacuum secondary electron detector compares power spectra of electron microscope images detected in different vacuums. For example, a signal that has a certain frequency and is included in an image detected in a vacuum of 50 Pa has a higher intensity than a signal that has the same frequency and is included in an image detected in a vacuum of 10 Pa on the basis of power spectra of the images, and it can be said that the quality of the image detected in the vacuum of 50 Pa is highest. In addition, in general, when the intensity of a primary electron with which the specimen is irradiated is reduced due to the position of the specimen or a vacuum atmosphere in the specimen chamber, or when the intensity of a signal that is generated from the specimen and is to be detected is reduced due to the position of the specimen or the vacuum atmosphere in the specimen chamber, the intensity of the signal is reduced, and the signal includes noise. Thus, a frequency characteristic of the signal to be detected is degraded. When power spectra of backscattered electron signals detected in different vacuums are compared, the intensities of the signals to be detected are reduced due to the aforementioned low-vacuum atmosphere. Thus, as the vacuum level is reduced, the frequency characteristic is degraded and the quality of the image is reduced. However, the signal detected by the low-vacuum secondary electron detector is amplified by the gas amplification of the residual gas. Thus, in order to improve the detection efficiency, a certain amount of the residual gas is required. Frequency characteristics of a power spectrum detected in the vacuum of 50 Pa are higher than frequency characteristics of a power spectrum detected in the vacuum of 10 Pa, and the intensity of a signal detected in the vacuum of 50 Pa is higher than the intensity of a signal detected in the vacuum of 10 Pa. The level of a vacuum in which the signal detection efficiency of the low-vacuum secondary electron detector is highest varies depending on components of molecules of the residual gas. For example, it is assumed that the residual gas causes the detection efficiency to be highest when the vacuum level is 50 Pa. In the assumption, in order to detect a power spectrum in a vacuum of 100 Pa that is higher than the vacuum of 50 Pa, frequency characteristics are reduced due to scattering of the electron beam, although the amount of the residual gas that causes the gas amplification is sufficient. Therefore, the quality of the image is reduced.

When the backscattered electron detector is used, the working distance is set to a range of 10 mm to 15 mm and the vacuum level is set to a range of 10 Pa to 15 Pa, for example. When the low-vacuum secondary electron detector is used, the working distance is set to a range of 15 mm to 25 mm and the vacuum level is set to a range of 50 Pa to 60 Pa. Thus, traditionally, it is necessary that an operator switch settings to suitable observation conditions and observe an image every time a detector needs to be switched. In addition, if the operator does not have knowledge on the optimal observation conditions and any experience, the operator may observe an image without an operation of changing the observation conditions when the detector is switched. In this case, the operator observes the image obtained under the observation conditions that are not suitable, and the electron microscope cannot exhibit the highest performance.

In the present embodiment, a signal selection operation unit 18, a CPU 19, an observation condition memory 20, a motor 21, an image processing unit 22 and a power spectrum memory 23 are provided.

A screen is displayed on the signal selection operation unit 18 and used to set conditions that are criteria for selection of a signal.

An example of the display screen of the signal selection operation unit 18 that is used for the electron microscope according to the present embodiment is described with reference to FIG. 2.

Figure 2:
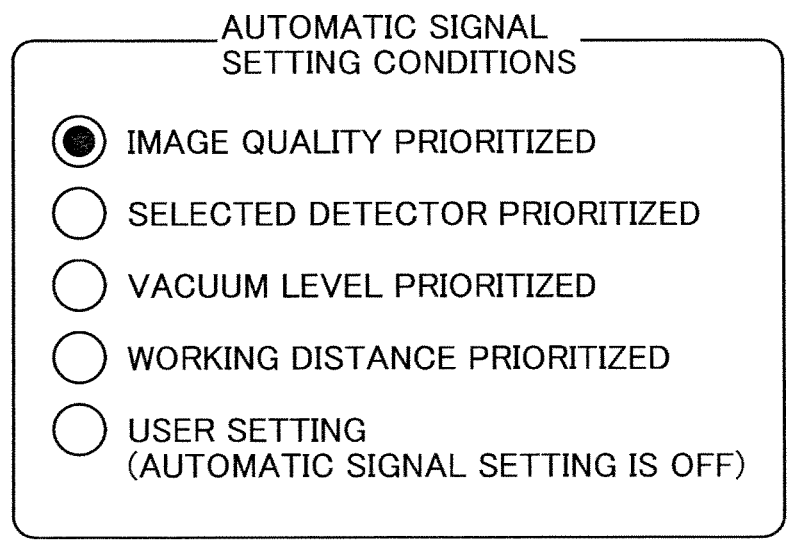
FIG. 2 is a diagram showing an example of a display screen of a signal selection operation unit that is used for the electron microscope according to the embodiment of the present invention.

FIG. 2 is a diagram showing the example of the display screen of the signal selection operation unit 18 that is used for the electron microscope according to the present embodiment of the invention.

As shown in FIG. 2, selection criteria including an image quality prioritized, a selected detector prioritized, a vacuum level prioritized, a working distance prioritized, and a user setting are displayed on the signal selection operation unit 18. The operator uses the signal selection operation unit 18 to select an observation condition that is a selection criterion for a signal to be switched by the signal switch 14. In the example shown in FIG. 2, the image priority prioritized is selected.

A setting value of the position (the working distance that is a distance between an edge of the objective lens 4 and a top surface of the specimen stage 5) of the specimen is stored in the observation condition memory 20 for each of the types of the detectors. In addition, set values of the vacuum level, the acceleration voltage and the diameter of the electron beam or a current of the electron beam are stored in the observation condition memory 20 for each of the types of the detectors. For example, the following information is stored for the backscattered electron detector: information indicating that the working distance needs to be set to 10 mm, the vacuum level needs to be set to 10 Pa, the acceleration voltage needs to be set to 10 kV, and the diameter of the electron beam needs to be set to 50. The following information is stored for the low-vacuum secondary electron detector: information indicating that the working distance needs to be set to 20 mm, the vacuum level needs to be set to 50 Pa, the acceleration voltage needs to be set to 15 kV, and the diameter of the electron beam needs to be set to 60.

Although the setting values of the working distance, the acceleration voltage and the diameter of the electron beam, which are provided for each of the types of the detectors, are determined in advance and stored in the observation condition memory 20, they can be changed to values empirically determined to be suitable for the specimen to be observed.

The CPU 19 reads the setting values (stored for each of the types of the detectors) of the position of the specimen, the vacuum level, the acceleration voltage and the diameter of the electron beam from the observation condition memory 20 on the basis of a criterion selected by the signal selection operation unit 18. The CPU 19 drives the motor 21 so that the working distance is changed. In addition, the CPU 19 controls the opening amount of the leak valve 8 and thereby controls the amount of air to be introduced into the specimen chamber 7 so that the vacuum level in the specimen chamber 7 is adjusted. Furthermore, the CPU 19 controls the high-voltage generation circuit 30 and the lens control circuit 31 and thereby sets the acceleration voltage and the amount of the electron beam to be focused by the focusing lens so that the diameter of the electron beam is controlled. In this case, the discharge device 6 always evacuates the specimen chamber 7. Thus, when the opening degree of the leak valve 8 is set to a small value, the vacuum level can be set to a high vacuum level. When the opening degree of the leak valve 8 is set to a large value, the vacuum level can be set to a low vacuum level.

When the image processing device 22 uses frequency characteristics of the image signals in order to evaluate the qualities of the images, the image processing device 22 performs Fourier transform on the image data obtained by the detectors and stored in the frame memory 16, calculates power spectra and causes the calculated power spectra to be stored in the power spectrum memory 23. The power spectra stored in the power spectrum memory 23 are used to determine which case is superior in the image quality between a case in which the backscattered electron detector is used and a case in which the low-vacuum secondary electron detector is used, in the image quality prioritized mode.

The image processing device 22 can measure SN ratios that are the ratios of signals included in the images to noise and evaluate the qualities of the images expressed by the two-dimensional image signals. When the SN ratios are to be measured in order to evaluate the qualities of the images, the image processing device 22 measures the SN ratios from the images obtained from the detectors and stored in the frame memory 16. As a method for measuring the SN ratios, the following method can be used, for example. In the method, two or more images that are the same are measured, and covariance of the images is calculated. Noise may randomly occur in the images and is not correlated with the images. As the covariance is higher, the number of signals that are the same and correlated with each other in the two images and stored is larger. When the number of the signals that are the same and correlated with each other in the two images and stored is large, it can be determined that the SN ratios are high. It can be determined that as the SN ratios are higher, the qualities of the images are higher.

Next, operations that are performed by the electron microscope according to the present embodiment in the operation of selecting a signal are described with reference to FIG. 3.

Figure 3:
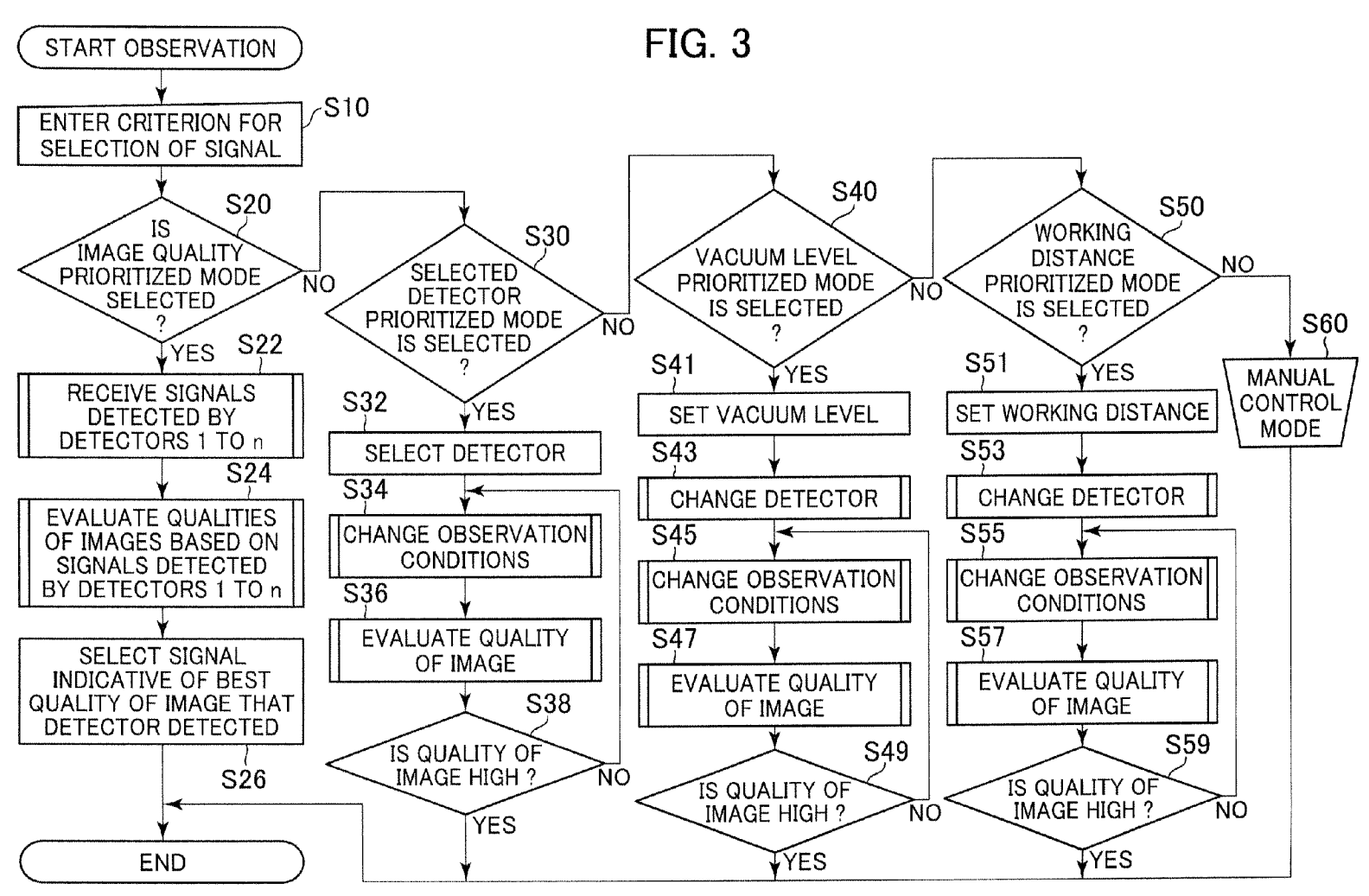

FIG. 3 is a flowchart of the operations that are performed by the electron microscope according to the embodiment of the present invention in the operation of selecting a signal.

In step S10, information indicating an observation condition as a selection criterion for a signal to be switched by the signal switch 14 is entered from the signal selection operation unit 18.

Next, in step S20, it is determined whether or not the image quality prioritized mode is selected. When the image quality prioritized mode is selected, the process proceeds to step S22. When the image quality prioritized mode is not selected, the process proceeds to step S30.

In the image quality prioritized mode, images that are obtained by the detectors are received, the qualities of the images obtained by the detectors are measured, and a signal that is obtained by a detector providing a higher quality of the image is output to the image display device 17.

When the image quality prioritized mode is selected, the CPU 19 acquires signals obtained by the plurality of detectors in step S22. For example, the CPU 19 reads, from the observation condition memory 20 (storing the setting values of the position of the specimen, the vacuum level, the acceleration voltage and the diameter of the electron beam for each of the types of the detectors), the setting values of the working distance, the vacuum level, the acceleration voltage and the diameter of the electron beam for the backscattered electron detector when the backscattered electron detector is selected. The setting values of the working distance, the vacuum level, the acceleration voltage and the diameter of the electron beam, which are suitable for each of the detectors, are measured in advance so that a large amount of signals are detected. The measured setting values are stored in the observation condition memory 20.

The CPU 19 drives the motor 21 to cause the motor 21 to move the specimen stage 12 in a vertical direction and sets the actual working distance so that the actual working distance is equal to the working distance read from the observation condition memory 20. In addition, the CPU 19 sets the opening amount of the leak valve 8 so that the actual vacuum level is equal to the vacuum level read from the observation condition memory 20. Furthermore, the CPU 19 controls the high-voltage generation circuit 30 and the lens control circuit 31 to set the actual acceleration voltage and the amount of the electron beam to be focused so as to control the diameter of the electron beam. After the working distance, the vacuum level, the acceleration voltage and the diameter of the electron beam are set to the setting values, the CPU 19 controls the signal switch 14 so that the signal switch 14 selects a signal detected by the backscattered electron detector. In addition, the CPU 19 causes the analog digital converter 15 to convert the signal detected by the backscattered electron detector into a digital signal and causes the digital signal to be stored in the frame memory 16 as backscattered electron image data. The image processing device 22 measures the quality of the backscattered electron image stored in the frame memory 16.

Next, the CPU 19 reads the setting values of the working distance, the vacuum level, the acceleration voltage and the diameter of the electron beam for the low-vacuum secondary electron detector from the observation condition memory 20 and sets the observation conditions. Then, the CPU 19 causes the signal switch 14 to select a signal detected by the low-vacuum secondary electron detector and causes the analog digital converter 15 to convert the signal detected by the low-vacuum secondary electron detector into a digital signal. Then, the CPU 19 causes the digital signal to be stored in the frame memory 16 as low-vacuum secondary electron image data. The quality of the low-vacuum secondary electron image stored in the frame memory 16 is measured by the image processing device 22.

Next, in step S24, the image processing device 22 compares the quality of the backscattered electron image with the quality of the low-vacuum secondary electron image. When the frequency characteristics of the image signals are used to evaluate the qualities of the images, signals of up to a high frequency band that expresses a fine structure of the specimen on a power spectrum are detected from the frequency characteristics of the detected signals. In addition, the image processing device 22 determines that the quality of an image that is obtained by any of the detectors and has a signal with an intensity corresponding to a frequency corresponding to a surface structure of the specimen is more excellent. When the method for measuring the SN ratios of the images is used to evaluate the qualities of the images, the SN ratios of the detected signals are measured. The image processing device 22 determines that the quality of an image that has a higher SN ratio and is obtained by any of the detectors is more excellent.

Next, in step S26, the CPU 19 causes the signal switch 14 to select a signal detected by any of the detectors so that the selected signal that expresses the image with the quality determined to be more excellent by the image processing device 22 is displayed. In addition, the CPU 10 reads, from the observation condition memory 20, the setting values of the working distance, the vacuum level, the acceleration voltage and the diameter of the electron beam so that the read setting values are suitable for the selected detector. Then, the CPU 19 performs the aforementioned control so that the actual working distance, the actual vacuum level, the actual acceleration voltage and the actual diameter of the electron beam are equal to the setting values, respectively. After the these processes are performed, an image that has a higher quality and is obtained by either the backscattered electron detector or the low-vacuum secondary electron detector can be automatically selected and output by outputting the image data stored in the frame memory 16 to the image display device 17.

In addition, after the detector that provides the image with the higher quality is determined, signals that are detected under the observation conditions for each of the detectors are stored in the frame memory 16 while the setting values that represent the working distance, the vacuum level, the acceleration voltage and the diameter of the electron beam for each of the detectors and are stored in the observation memory 20 are changed. Then, the image processing device 22 compares the qualities of the images obtained under the observation conditions. The CPU 19 determines observation conditions that cause an evaluated value of the quality of an image to be highest. The setting values that represent the working distance, the vacuum level, the acceleration voltage and the diameter of the electron beam are set to the observation conditions that cause the evaluated value of the quality of the image to be highest. Thus, a detector that provides an image with a high quality and is suitable for the specimen to be observed can be selected, and the observation conditions can be set.

When it is determined that the image quality prioritized mode is not selected in step S20, the CPU 19 determines whether or not the selected detector prioritized mode is selected in step S30. When the selected detector prioritized mode is selected, the process proceeds to step S32. When the selected detector prioritized mode is not selected, the process proceeds to step S40.

The selected detector prioritized mode is a mode that is selected by the signal selection operation unit 18 when a detector to be selected is already determined on the basis of a desired characteristic of an image and an irregularity in the image since the characteristic of the image and the irregularity in the image vary depending on the detection method of each of the detectors.

When the selected detector prioritized mode is selected, the CPU 19 reads, from the observation condition memory 20, setting values that represent the working distance, the vacuum level, the acceleration voltage and the diameter of the electron beam and are suitable for a detector that is currently used in step S32. Then, the CPU 19 performs the aforementioned control so that the actual conditions are set to the read observation conditions.

Next, in step S34, the image processing device 22 measures the quality of the image obtained at this time, and changes the observation conditions by certain amounts again. The image processing device 22 evaluates the quality of the image again.

In step S36, the CPU 19 repeats the aforementioned operations predetermined times, determines observation conditions that cause the evaluated value of the quality of the image to be highest, and sets the determined observation conditions so that the observation can be performed using the selected detector under the observation conditions causing the quality of the image to be highest.

According to the method disclosed herein, the observation conditions can be set to the optimal observation conditions set in advance while the currently selected and desired detector is not changed. The image observation that is suitable for the selected detector can be performed without consideration of the details of the observation conditions.

When the CPU 19 determines that the selected detector prioritized mode is not selected in step S30, the CPU 19 determines whether or not the vacuum level prioritized mode is selected in step S40. When the vacuum level prioritized mode is selected, the process proceeds to step S41. When the vacuum level prioritized mode is not selected, the process proceeds to step S50.

The vacuum level prioritized mode is a mode that is selected by the signal selection operation unit 18 when the vacuum level is already determined for observation on the basis of a material of the specimen (such as a nonmetal specimen such as a biological specimen that is not coated with metal) to be observed.

When the vacuum level prioritized mode is selected, the CPU 19 sets the vacuum level in step S41.

Next, in step S43, the CPU 19 reads, from the observation condition memory 20, the setting values that represent the vacuum level for the detectors, and controls the signal switch 14 so that a signal that is detected by any of the detectors at a current vacuum level that is closer to the vacuum level suitable for the detector is displayed.

In step S45, the CPU 19 reads, from the observation condition memory 20, the setting values that represent the working distance, the acceleration voltage and the diameter of the electron beam and are suitable for the selected detector, and performs control so that the actual working distance, the actual acceleration voltage and the actual diameter of the electron beam are set to the aforementioned setting values.

Next, in step S47, the image processing device 22 measures the quality of the image obtained at this time, and changes, by certain amounts, the setting values that represent the working distance, the acceleration voltage and the diameter of the electron beam again, and the image processing device 22 measures the quality of the image again.

In step S49, the CPU 19 repeats the aforementioned operations predetermined times, determines observation conditions causing the evaluated value of the quality of the image to be highest, and sets the observation conditions (excluding the vacuum level) that cause the evaluated value of the quality of the image to be highest so that the observation can be performed under the observation conditions that cause the quality of the image to be highest.

The vacuum level that causes the detection efficiency to be highest varies depending on the detector according to a principle of a signal detection method by the detector. According to the method disclosed herein, however, a detector that causes the efficiency of detecting a signal to be highest can be selected without consideration of the currently set vacuum level, and the image observation can be performed under the observation conditions suitable for the selected detector.

When it is determined that the vacuum level prioritized mode is not selected in step S40, the CPU 19 determines whether or not the working distance prioritized mode is selected in step S50. When the working distance prioritized mode is selected, the process proceeds to step S51. When the working distance prioritized mode is not selected, the process proceeds to step S60.

When the working distance prioritized mode is selected, the CPU 19 sets the working distance in step S51.

Next, in step S53, the CPU 19 reads, from the observation condition memory 20, the setting values that represent the working distance and are suitable for the detectors, and the CPU 19 controls the signal switch 14 so that a signal that is detected by a detector while the current working distance is closer to the working distance suitable for the detector is displayed.

In step S55, the CPU 19 reads, from the observation condition memory 20, the setting values that represent the vacuum level, the acceleration voltage and the diameter of the electron beam and are suitable for the selected detected, and the CPU 19 performs the control so that the actual vacuum level, the actual acceleration voltage and the actual diameter of the electron beam are set to the aforementioned setting values.

Next, in step S57, the image processing device 22 measures the quality of the image obtained at this time, changes, by certain amounts, the setting values of the vacuum level, the acceleration voltage and the diameter of the electron beam again, and measures the quality of the image again.

In step S59, the CPU 19 repeats the aforementioned operations predetermined times, determines observation conditions causing the evaluated value of the quality of the image to be highest, and sets the observation conditions causing the evaluated value of the quality of the image so that the observation can be performed under the observation conditions that cause the quality of the image to be highest.

The working distance that causes the detection efficiency to be highest varies depending on the detector according to a principle of a signal detection method by the detector. According to the method disclosed herein, however, a detector that causes the efficiency of detecting a signal to be high can be selected without consideration of the currently selected working distance, and the image observation can be performed under the observation conditions suitable for the selected detector.

When the user setting is selected by the signal selection operation unit 18, the CPU 19 sets a manual control mode so that the operator selects a detector and separately sets setting values that represent the working distance, the vacuum level, the acceleration voltage and the diameter of the electron beam in step S60.

The means for selecting one of the two types of the detectors is described above. However, when the electron microscope includes three or more detectors, the embodiment can apply to the case in which the electron microscope includes the three or more detectors. For example, a high-vacuum secondary electron detector or a transparent electron image detector using a scintillator or the like can be used in addition to the aforementioned two types of the detectors.

In addition, since the amount of the electron beam current can be controlled instead of the control of the diameter of the electron beam, the CPU 19 can call the amount of the electron beam current from the observation condition memory 29 as an observation condition on the basis of a detector selected from among the plurality of detectors and control the amount of the electron beam to be focused by the focusing lens of the electron microscope so that the actual amount of the electron beam current is equal to the called amount of the electron beam current.

As described above, according to the present embodiment, preferential observation conditions that are used to select a detector are entered in the electron microscope that has the plurality of detectors. In the electron microscope, the detector that provides an image with a high quality under the preferential observation conditions is selected, and observation conditions other than the preferential observation conditions are set to the optimal values for the selected detector. Thus, the detector that provides the image with the high quality is automatically selected on the basis of the observation conditions. Even when the operator does not have much experience, the operator can easily observe the image.

DESCRIPTION OF REFERENCE NUMERALS

1 . . . Electron gun
2 . . . Electron beam
3 . . . Focusing lens
4 . . . Objective lens
5 . . . Sample
6 . . . Discharge device
7 . . . Sample chamber
8 . . . Leak valve
9 . . . Reflected electron detecting element 10 ... Amplifier of backscattered electron detector
11 ... Bias electrode
12 ... Sample stage
13 ... Amplifier of low-vacuum secondary electron detector
14 ... Signal switch
15 ... Analog digital converter
16 ... Frame memory
17 ... Image display device
18 ... Signal selection operation unit
19 ... CPU
20 ... Observation condition memory
21 ... Motor for driving stage
22 ... Image processing device
23 ... Power spectrum memory
30 ... High-voltage generation circuit
31 ... Lens control circuit

The invention claimed is:

1. An electron microscope comprising:
a plurality of detectors that are different from each other in type of detection method, the plurality of detectors configured to detect signals generated by irradiation of a specimen with an electron beam;
a signal switch for switching the signals detected by the plurality of detectors;
a storage for storing observation conditions each including a working distance of the electron microscope for a corresponding one of the plurality of detectors; and
a controller for reading one of the observation conditions which include the working distance stored in the storage on the basis of switching of the plurality of detectors and changing a position of a specimen stage included in the electron microscope at least upward or downward so that an actual working distance is set to the working distance read by the controller.

2. The electron microscope according to claim 1, further comprising:
an image processor for converting the signals detected by the plurality of detectors and obtained on the basis of the switching of the plurality of detectors into two-dimensional image signals, the switching being controlled by the controller, and evaluating qualities of images of the two-dimensional image signals,
wherein the controller selects a detector causing an evaluated value to be highest from among the plurality of detectors on the basis of results of evaluation performed by the image processor, the controller causing one of the images of the two-dimensional image signals to be displayed.

3. The electron microscope according to claim 2, wherein the image processor uses frequency characteristics of the image signals to evaluate the qualities of the images of the two-dimensional image signals.

4. The electron microscope according to claim 2, wherein the image processor measures SN ratios that are ratios of the signals included in the images to noise so as to evaluate the qualities of the images of the two-dimensional image signals.

5. The electron microscope according to claim 1, wherein the observation conditions include a vacuum level, and wherein the controller reads the vacuum level stored in the storage on the basis of the switching of the plurality of detectors, and controls a vacuum level in a specimen chamber included in the electron microscope so that the vacuum level in the specimen chamber is set to the vacuum level read by the controller.

6. The electron microscope according to claim 1, wherein the observation conditions include an acceleration voltage, and wherein the controller reads the acceleration voltage stored in the storage on the basis of the switching of the plurality of detectors, and controls a high-voltage generation circuit included in the electron microscope so that an actual acceleration voltage is set to the acceleration voltage read by the controller.

7. The electron microscope according to claim 1, wherein the observation conditions include a diameter of the electron beam, and wherein the controller reads the electron beam diameter stored in the storage on the basis of the switching of the plurality of detectors, and controls an amount of the electron beam to be focused by a focusing lens included in the electron microscope so that an actual diameter of the electron beam is set to the diameter of the electron beam read by the controller.

8. The electron microscope according to claim 1, wherein the observation conditions include an amount of an electron beam current, and wherein the controller reads the electron beam current amount stored in the storage on the basis of the switching of the plurality of detectors, and controls an amount of the electron beam to be focused by a focusing lens included in the electron microscope so that an actual amount of the electron beam current is set to the amount of the electron beam current read by the controller.

9. The electron microscope according to claim 1, further comprising:
a signal setting operation unit that sets the observation conditions that are criteria for selection of the plurality of detectors.

* * * * *